United States Patent
He

(10) Patent No.: US 11,183,519 B2
(45) Date of Patent: Nov. 23, 2021

(54) METHOD AND APPARATUS FOR MANUFACTURING TFT SUBSTRATE

(71) Applicant: HKC Corporation Limited, Guangdong (CN)

(72) Inventor: Huailiang He, Chongqing (CN)

(73) Assignee: HKC CORPORATION LIMITED, Shenzhen (CN)

( * ) Notice: Subject to any disclaimer, the term of this patent is extended or adjusted under 35 U.S.C. 154(b) by 43 days.

(21) Appl. No.: 16/643,415

(22) PCT Filed: Dec. 13, 2017

(86) PCT No.: PCT/CN2017/115861
§ 371 (c)(1),
(2) Date: Feb. 28, 2020

(87) PCT Pub. No.: WO2019/041630
PCT Pub. Date: Mar. 7, 2019

(65) Prior Publication Data
US 2020/0258917 A1 Aug. 13, 2020

(30) Foreign Application Priority Data
Aug. 29, 2017 (CN) .......................... 201710757117.8

(51) Int. Cl.
 *H01L 21/00* (2006.01)
 *H01L 27/12* (2006.01)
 *H01L 21/28* (2006.01)

(52) U.S. Cl.
 CPC .... *H01L 27/1244* (2013.01); *H01L 21/28247* (2013.01); *H01L 27/1259* (2013.01)

(58) Field of Classification Search
 CPC .......... H01L 27/1244; H01L 21/28247; H01L 27/1259
 See application file for complete search history.

(56) References Cited

U.S. PATENT DOCUMENTS

| 5,100,504 A | 3/1992 | Kawai | |
| 2003/0096458 A1* | 5/2003 | Park | H01L 27/12 438/149 |
| 2011/0156023 A1* | 6/2011 | Ieda | H01L 27/12 257/43 |
| 2011/0269266 A1* | 11/2011 | Yamazaki | H01L 29/66969 438/104 |

FOREIGN PATENT DOCUMENTS

| CN | 101379214 A | 3/2009 |
| CN | 103474416 A | 12/2013 |
| CN | 105448938 A | 3/2016 |

* cited by examiner

*Primary Examiner* — Richard A Booth
(74) *Attorney, Agent, or Firm* — Muncy, Geissler, Olds & Lowe, P.C.

(57) ABSTRACT

A method of manufacturing a TFT substrate and a manufacturing apparatus of a TFT substrate are provided. The method of manufacturing a TFT substrate comprises: forming active switches on a substrate; forming transparent electrode layer on the active switches; and forming a pixel layer on the transparent electrode layer. The step of forming the active switches on the substrate comprises: forming a metal layer on the substrate; bombarding the metal layer with hydrogen ions; and forming a protection layer on the metal layer.

9 Claims, 6 Drawing Sheets

METHOD AND APPARATUS FOR MANUFACTURING TFT SUBSTRATE

BACKGROUND

Technical Field

This disclosure relates to a technical field of a display, and more particularly to a method and an apparatus for manufacturing a TFT substrate.

Related Art

The display has many advantages, such as the slim body, the power-saving property, the radiation less property and the like, and has been widely used. Most of the displays in the existing market are backlight displays, which include a display panel and a backlight module. The working principle of the display panel is to refract the light rays from the backlight module to produce a frame by placing liquid crystal molecules in two parallel substrates, and by applying a driving voltage to the two substrates to control the orientations of the liquid crystal molecules.

A thin film transistor-liquid crystal display (TFT-LCD) has the low power consumption, excellent frame quality and high production yield and other performances, and has now gradually occupied the dominant position in the display field. Similarly, the TFT-LCD includes the display panel and the backlight module. The display panel includes a color filter substrate (CF substrate, also referred to as a color filter substrate) and a thin film transistor substrate (TFT substrate), and the transparent electrode is present on the opposite inner sides of the above-mentioned substrates. A layer of liquid crystal (LC) molecules is disposed between the two substrates. The display panel can provide an electric field to control the orientation of the liquid crystal molecules for changing the polarization of light, and the polarizer is configured to allow the polarized light to pass through or be blocked, thereby achieving the display function.

The process metal layer of the existing display panel may have the oxidation problem to cause the poor contact between metal layers and thus affect the display effect of the display panel.

SUMMARY

The technical problem to be solved by this disclosure is to provide a method of manufacturing a TFT substrate capable of effectively solving the problem of the surface oxidation of the metal layer.

This disclosure also provide a manufacturing apparatus of a TFT substrate.

To achieve the above, the disclosure provides a method of manufacturing a TFT substrate, comprising: providing a substrate; forming a metal layer on the substrate; bombarding the metal layer with hydrogen ions; forming a protection layer on the metal layer. The substrate is disposed with an active switch, a scan line and a data line perpendicular to the scan line, the active switch comprises a metal layer, a scan line and a data line coupled to the active switch, and the metal layer comprises a first metal layer, a second metal layer, a scan line and a data line.

The step of bombarding the metal layer with the hydrogen ions comprises: dissociating hydrogen into hydrogen atoms; ionizing the hydrogen atoms into the hydrogen ions; and bombarding the metal layer with the hydrogen ions.

Through the manufacturing apparatus of the TFT substrate, the molecules of hydrogen in the mixed gas are dissociated into two hydrogen atoms, and the hydrogen atom is further ionized into hydrogen ions carrying positive charges and electrons carrying negative charges. Bombarding the surface of the metal layer through the ionized hydrogen ions can effectively solve the problem of the surface oxidation of the metal layer.

In one embodiment, the protection layer includes a first protection layer and a second protection layer, a first metal layer is provided on the substrate, the first protection layer is provided on the first metal layer, a second metal layer is provided on the first protection layer, and the second protection layer is provided on the second metal layer. The provision of the first protection layer and the second protection layer can effectively protect the metal layer, and further avoid the surface oxidation condition of the metal layer. When the region, having problems caused by the process of the display panel, is reworked, the protection layer can very effectively prevent the detergent from direct eroding the metal layer of the TFT substrate, so that the metal layer can be kept intact, the breaking problem can be prevented, the rework success rate of the display panel can be thus enhanced, and the scrapping cost can be decreased.

In one embodiment, the second protection layer is formed with a transparent electrode layer, the second protection layer is provided with an opening, and the transparent electrode layer is connected to the second metal layer through the opening. By providing the opening on the second protection layer, it is convenient for the transparent electrode layer to be connected to the second metal layer, and it is ensured that the display panel has good display effect. Before the transparent electrode layer is provided, using the hydrogen ions to bombard the second metal layer at the opening can effectively solve the problem of the surface oxidation of the second metal layer. The redox reaction of the hydrogen ions can reduce the metal oxide on the second metal layer to the metal.

In one embodiment, the first metal layer and the second metal layer are made of copper, aluminum, silver, gold or an alloy of the above-mentioned metals.

In one embodiment, each of the first protection layer and the second protection layer is a silicon nitride layer and/or a silicon oxide layer.

In one embodiment, the first protection layer and the second protection layer are stacked in two layers.

In one embodiment, the first protection layer and the second protection layer are made of the same material.

In one embodiment, the first protection layer and the second protection layer are made of different materials.

In one embodiment, the step of forming the metal layer on the substrate comprises forming the first metal layer on the substrate; the step of bombarding the metal layer with the hydrogen ions comprises bombarding the first metal layer with the hydrogen ions; and the step of forming the protection layer on the metal layer comprises forming the first protection layer on the first metal layer.

Before the first protection layer is provided, using the hydrogen ions to bombard the first metal layer can effectively solve the problem of the surface oxidation of the first metal layer. Using the reduction-oxidation (redox) reaction of the hydrogen ions to reduce the metal oxide to the metal can simultaneously effectively solve the problem of the too-short waiting time between the processes of the first metal layer and the first protection layer.

In one embodiment, the step of forming the metal layer on the substrate comprises forming the second metal layer on the first protection layer; the step of bombarding the metal layer with the hydrogen ions comprises bombarding the second metal layer with the hydrogen ions; and the step of forming the protection layer on the metal layer comprises forming the second protection layer on the second metal layer.

Before the second protection layer is provided, using the hydrogen ions to bombard the second metal layer can effectively solve the problem of the surface oxidation of the second metal layer. Using the reduction-oxidation (redox) reaction of the hydrogen ions to reduce the metal oxide to the metal can simultaneously effectively solve the problem of the too-short waiting time between processes of the second metal layer and the second protection layer.

In one embodiment, the method comprises: forming the first metal layer on the substrate; bombarding the first metal layer with the hydrogen ions to form the scan lines and gates of the active switches; forming the first protection layer, a semiconductor layer, and the second metal layer on the first metal layer; bombarding the second metal layer with the hydrogen ions to form the data lines, and sources and drains of the active switches; forming the second protection layer on the second metal layer; and forming the transparent electrode layer connected to the drains on the second protection layer.

In one embodiment, the method comprises: forming the first metal layer on the substrate; bombarding the first metal layer with the hydrogen ions to form the scan lines and gates of the active switches; forming the first protection layer and a semiconductor layer on the first metal layer; forming the second metal layer on the semiconductor layer; bombarding the second metal layer with the hydrogen ions to form the data lines, and sources and drains of the active switches; forming the second protection layer on the second metal layer; and forming the transparent electrode layer connected to the drains on the second protection layer.

According to another aspect of this disclosure, this disclosure further discloses a manufacturing apparatus of a TFT substrate. The manufacturing apparatus comprises a gas inlet, a dissociating device, a gas outlet, and a coating device. The gas inlet is configured to inject hydrogen and air. The dissociating device is configured to dissociate the hydrogen into hydrogen ions. The gas outlet is configured to release the hydrogen ions to bombard a metal layer. The coating device is configured to form a protection layer on the metal layer. The manufacturing apparatus further comprises a housing. The gas inlet and the gas outlet are disposed on the housing, the dissociating device is disposed inside the housing, the dissociating device comprises a high voltage electrode and a ceramic electrode, and the dissociating device is connected to the gas inlet through a cooling sleeve. Injecting the mixed gas of the hydrogen and the air through the gas inlet can effectively avoid the excessive hydrogen concentration, and thus further ensure the production security of the display panel. When the hydrogen passes through the dissociating device, the high voltage electrode and the ceramic electrode cooperate to make the hydrogen form the hydrogen ions. The hydrogen ions pass through the gas outlet, accelerate and fly to the surface of the metal layer to treat the metal layer on the display panel, and this can effectively solve the problem of the surface oxidation of the metal layer. The redox reaction of the hydrogen ions can reduce the metal oxide to the metal.

In one embodiment, the housing comprises an anti-electrostatic board, and the gas outlet is disposed on the anti-electrostatic board. The anti-electrostatic board can effectively isolate the electrostatic charges, and ensure that the manufacturing apparatus is capable of making the hydrogen ions better act on the surface of the metal layer. The hydrogen ions pass through the gas outlet accelerate and fly to the surface of the metal layer to treat the metal layer on the display panel, and this can effectively solve the problem of the surface oxidation of the metal layer.

According to still another aspect of this disclosure, this disclosure further discloses a display panel manufactured by the above-mentioned method of manufacturing the TFT substrate.

According to still another aspect of this disclosure, this disclosure further discloses a method of manufacturing a TFT substrate, comprising: providing a substrate; forming a first metal layer on the substrate; dissociating hydrogen into hydrogen atoms; ionizing the hydrogen atoms into hydrogen ions; bombarding the first metal layer with the hydrogen ions to form scan lines and gates of active switches; forming a first protection layer and a semiconductor layer on the first metal layer; forming a second metal layer on the semiconductor layer; bombarding the second metal layer with the hydrogen ions to form data lines, and sources and drains of the active switches; forming a second protection layer on the second metal layer; and forming a transparent electrode layer connected to the drain on the second protection layer.

Before the protection layer is provided, using the hydrogen ions to bombard the metal layer can effectively solve the problem of the surface oxidation of the metal layer. Using the reduction-oxidation (redox) reaction of the hydrogen ions to reduce the metal oxide to the metal can simultaneously effectively solve the problem of the too-short waiting time between the processes of the metal layer and the protection layer. Using the hydrogen ions to bombard the metal layer in order to treat the oxide on the surface of the metal layer can treat the metal oxide more efficiently, effectively save the production time of the display panel, and further improve the production efficiency of the display panel. A protection layer is provided on the metal layer, which have been bombarded with the hydrogen ions, and the provision of the protection layer can effectively protect the metal layer, and further avoid the surface oxidation condition of the metal layer. In addition, the micro-structures on the lateral sides of the metal layers have the metal burr phenomenon, and the provisions of the protection layer can better cover the metal burrs on the metal layer and very effectively prevent the metal burrs from being exposed outside the protection layer, so that the protection layer can better protect the metal layer. Meanwhile, the provision of the protection layer makes the region, having the problems caused by the process, be reworked and repaired without scrapping the TFT substrate of the thin film transistors, so that the further green environment protection is achieved.

DETAILED DESCRIPTION OF THE INVENTION

Figure 1:
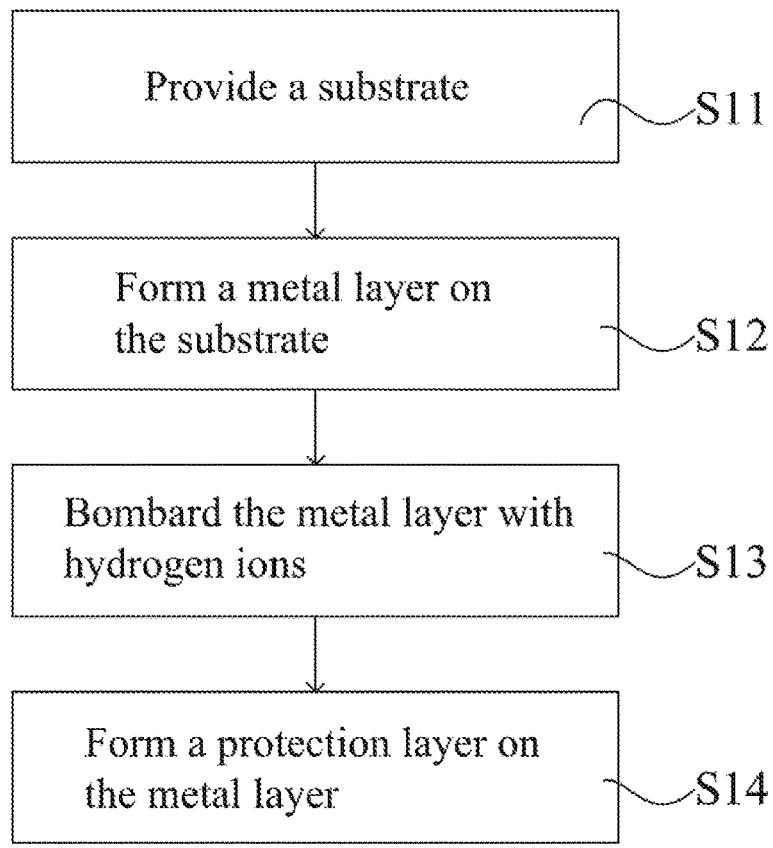
FIG. 1 is a flow chart showing a method of manufacturing an TFT substrate according to an embodiment of this disclosure.

Specific structures and function details disclosed herein are only for the illustrative purpose for describing the exemplary embodiment of this disclosure. However, this disclosure can be specifically implemented through many replacements, and should not be explained as being restricted to only the embodiment disclosed herein.

In the description of this disclosure, it is to be understood that the terms "center", "transversal", "up," "down," "left," "right," "vertical", "horizontal", "top," "bottom," "inside" and "outside" indicating the orientation or position relationships are the orientation or position relationships based on the drawing, are only provided for the purposes of describing this disclosure and simplifying the description, but do not indicate or imply that the directed devices or elements must have the specific orientations or be constructed and operated in the specific orientations, and thus cannot be understood as the restriction to this disclosure. In addition, the terms "first," and "second" are used for the illustrative purpose only and cannot be understood as indicating or implying the relative importance or implicitly specifying the number of indicated technical features. Therefore, the features restricted by "first" and "second" may expressly or implicitly comprise one or multiple ones of the features. In the description of this disclosure, unless otherwise described, the meaning of "multiple" comprises two or more than two. In addition, the terms "comprises" and any modification thereof intend to cover the non-exclusive inclusions.

In the description of this disclosure, it needs to be described that, unless otherwise expressly stated and limited, the terms "mount," "link" and "connect" should be broadly understood. For example, they may be the fixed connection, may be the detachable connection or may be the integral connection; may be the mechanical connection or may also be the electrical connection; or may be the direct connection, may be the indirect connection through a middle medium or may be the inner communication between two elements. It will be apparent to those skilled in the art that the specific meanings of the above terms in this application may be understood according to the specific conditions.

The terms used herein are for the purpose of describing only specific embodiments and are not intended to limit the exemplary embodiments. Unless the contexts clearly indicate otherwise, the singular form "one," "a" and "an" used here further intend to include plural forms. It should also be understood that the terms "comprising" and/or "including" are used herein to describe the features to describe the presence of stated features, integers, steps, operations, units and/or elements without excluding the presence or addition of one or more other features, integers, steps, operations, units, elements, and/or combinations thereof.

This disclosure is further described below with reference to the accompanying drawings and examples.

As shown in FIG. 1, a method of manufacturing a TFT substrate includes the following steps.

In a step S11, a substrate is provided.

In a step S12, a metal layer is formed on the substrate.

In a step S13: the metal layer is bombarded using hydrogen ions.

In a step S14, a protection layer is formed on the metal layer.

The substrate is disposed with an active switch, a scan line and a data line perpendicular to the scan line. The active switch includes a metal layer, a scan line and a data line coupled to the active switch. The metal layer includes a first metal layer, a second metal layer, a scan line and a data line.

Before the protection layer is provided, using the hydrogen ions to bombard the metal layer can effectively solve the problem of the surface oxidation of the metal layer. Using the reduction-oxidation (redox) reaction of the hydrogen ions to reduce the metal oxide to the metal can simultaneously effectively solve the problem of the too-short waiting time between the processes of the metal layer and the protection layer. Using the hydrogen ions to bombard the metal layer in order to treat the oxide on the surface of the metal layer can treat the metal oxide more efficiently, effectively save the production time of the display panel, and further improve the production efficiency of the display panel. A protection layer is provided on the metal layer, which have been bombarded with the hydrogen ions, and the provision of the protection layer can effectively protect the metal layer, and further avoid the surface oxidation condition of the metal layer. In addition, the micro-structures on the lateral sides of the metal layers have the metal burr phenomenon, and the provisions of the protection layer can better cover the metal burrs on the metal layer and very effectively prevent the metal burrs from being exposed outside the protection layer, so that the protection layer can better protect the metal layer. Meanwhile, the provision of the protection layer makes the region, having the problems caused by the process, be reworked and repaired without scrapping the TFT substrate of the thin film transistors, so that the further green environment protection is achieved. Of course, a mixed gas containing hydrogen ions may be adopted to bombard the metal layer, and the plasma state containing the hydrogen ions may also be adopted to bombard the metal layer.

The metal layer is made of copper, aluminum, silver, gold or an alloy of the above-mentioned metal, and is optionally made of pure copper. The pure copper has the good electroconductive performance and the lower resistivity. The copper is a less active metal and does not react with the oxygen in the dry air at the room temperature. In addition, the melting point of copper is lower, and the copper can be easily re-melted and re-smelted, and can be conveniently recycled. Meanwhile, the copper has the high reserve, the raw material can be conveniently purchased, and the manufacturing cost can be further controlled.

Figure 2:
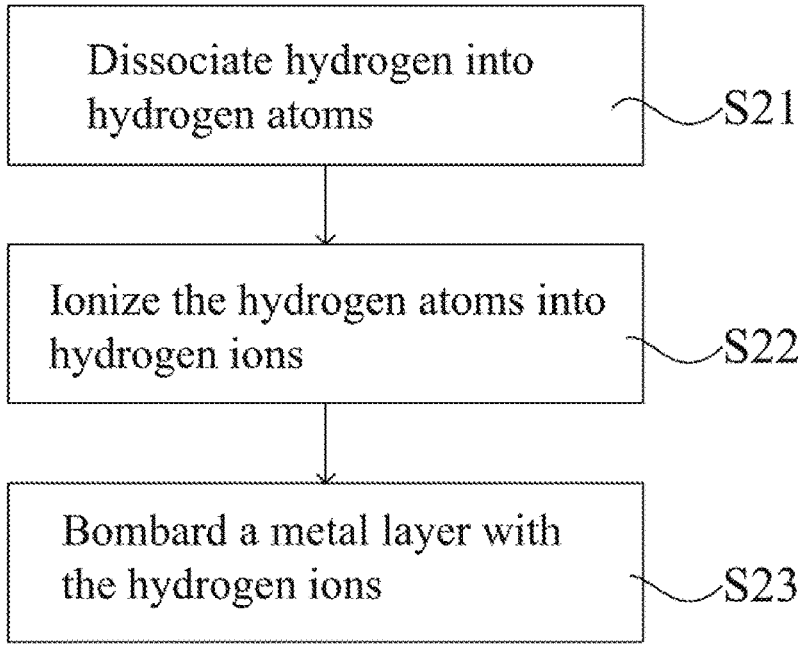
FIG. 2 is a flow chart showing a method of manufacturing an TFT substrate according to an embodiment of this disclosure.

As shown in FIG. 2, the method of bombarding the metal layer with the hydrogen ions includes the following steps.

In a step S21, the hydrogen is dissociated into hydrogen atoms.

In a step S22, the hydrogen atoms are ionized into hydrogen ions.

In a step S23, the metal layer is bombarded with the hydrogen ions.

Through a manufacturing apparatus 2 of the display panel, the molecules of hydrogen in the mixed gas are dissociated into two hydrogen atoms, and the hydrogen atom is further ionized into hydrogen ions carrying positive charges and electrons carrying negative charges. Bombarding the surface of the metal layer through the ionized hydrogen ions can effectively solve the problem of the surface oxidation of the metal layer. Using the redox reaction of the hydrogen ions to reduce the metal oxide to the metal can simultaneously effectively solve the problem of the too-short waiting time between the processes of the metal layer and the protection layer. The exemplary metal layer is made of the pure copper, hydrogen ions react with copper oxide, and using the redox reaction of the hydrogen ions to reduce the copper oxide to the metal copper effectively avoids the poor contact of the metal layers caused by the copper oxide, and further ensures the good display effect of the display panel. Then, the protection layer is provided by the vapor deposition or the chemical vapor deposition (CVD), and the provision of the protection layer can effectively protect the metal layer, and further avoid the surface oxidation condition of the metal layer.

Figure 3:
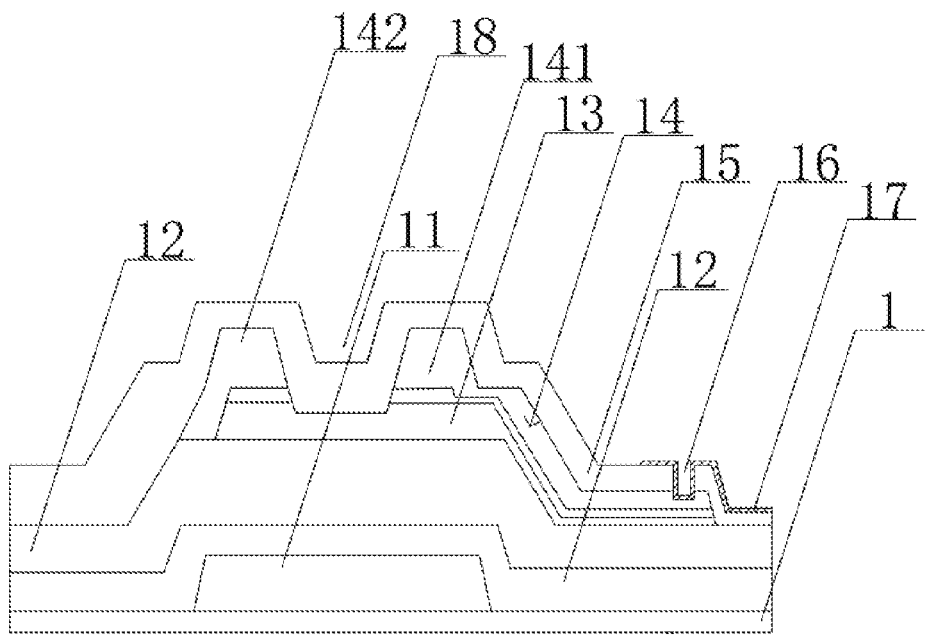
FIG. 3 is a schematic structure view showing a display panel according to an embodiment of this disclosure.

As shown in FIG. 3, the protection layer includes a first protection layer 12 and a second protection layer 15, a first metal layer 11 is provided on the substrate 1, the first protection layer 12 is provided on the first metal layer 11, a second metal layer 14 is provided on the first protection layer 12, the second protection layer 15 is provided on the second metal layer 14, the second metal layer 14 includes a source layer 141, a drain layer 142 and a trench 18 formed between the source layer 141 and the drain layer 142, and a semiconductor layer 13 is provided on the bottom portion of the trench 18. The provision of the first protection layer 12 and the second protection layer 15 can effectively protect the metal layer, and further avoid the surface oxidation condition of the metal layer. When the region, having problems caused by the process of the display panel, is reworked, the protection layer can very effectively prevent the detergent from direct eroding the metal layer of the TFT substrate, so that the metal layer can be kept intact, the breaking problem can be prevented, the rework success rate of the display panel can be thus enhanced, and the scrapping cost can be decreased. In addition, the micro-structures on the lateral sides of the metal layers have the metal burr phenomenon, and the provisions of the first protection layer 12 and the second protection layer 15 can better cover the metal burrs on the metal layer and very effectively prevent the metal burrs from being exposed outside the protection layer, so that the protection layer can better protect the metal layer. Meanwhile, the provision of the protection layer makes the region, having the problems caused by the process, be reworked and repaired without scrapping the TFT substrate of the thin film transistors, so that the further green environment protection is achieved.

The protection layer is a silicon oxide layer. That is, the protection layer is made of the silicon oxide material. Before the silicon oxide is deposited onto the metal layer using the chemical vapor deposition (CVD) technology, using the hydrogen ions to bombard the metal layer can effectively solve the problem of the surface oxidation of the metal layer, and using the redox reaction of the hydrogen ions to reduce the metal oxide to the metal can simultaneously effectively solve the problem of the too-short waiting time between the processes of the metal layer and the protection layer. After the chemical vapor deposition (CVD) is performed on the metal layer one time, the waiting for the first layer of the silicon oxide layer to cool and solidify into the first layer of the first protection layer 12 is conducted. After the second chemical vapor deposition (CVD) is performed on the first layer of the first protection layer 12, the second layer of the first protection layer 12 is formed. The above-mentioned steps are repeated, so that at least two layers of the silicon oxide layer are deposited on the metal layer, and thus better cover the metal layer and very effectively prevent the metal burrs from being exposed outside the protection layer, so that the protection layer can better protect the metal layer, do not react with the potassium hydroxide solution, effectively avoid the corrosion damage of the detergent on the metal layer, and can very well protect the metal layer. In addition, at least two silicon oxide layers are formed by performing multiple chemical vapor deposition processes, there is no need for extra replacement of raw materials on the midway, there is also no need for extra replacement of apparatuses, the raw material cost and the storage cost are decreased, no new material needs to be added to the bill of materials, and it is convenient to the flow manage and purchase. Meanwhile the chemical vapor deposition technology is mature, can well control the usage of the silicon oxide, and further decrease the production manufacturing cost, so that the display panel has a stronger product competitiveness. Of course, the second protection layer 15 may also be provided with two layers in the same method.

Of course, the protection layer can a silicon oxide layer. That is, the protection layer is made of the silicon oxide material. Before the silicon oxide is deposited onto the metal layer using the chemical vapor deposition (CVD) technology, using the hydrogen ions to bombard the metal layer can effectively solve the problem of the surface oxidation of the metal layer, and using the redox reaction of the hydrogen ions to reduce the metal oxide to the metal can simultaneously effectively solve the problem of the too-short waiting time between the processes of the metal layer and the protection layer. After the chemical vapor deposition (CVD) is performed on the metal layer one time, the waiting for the first layer of the silicon oxide layer to cool and solidify into the first layer of the first protection layer 12 is conducted. After the second chemical vapor deposition (CVD) is performed on the first layer of the first protection layer 12, the second layer of the first protection layer 12 is formed. The above-mentioned steps are repeated, so that at least two layers of the silicon oxide layer are deposited on the metal layer, and thus better cover the metal layer and very effectively prevent the metal burrs from being exposed outside the protection layer, so that the protection layer can better protect the metal layer, do not react with the potassium hydroxide solution, effectively avoid the corrosion damage of the detergent on the metal layer, and can very well protect the metal layer. The silicon nitride is a super hard substance, and the silicon nitride material withstands wear, resists the oxidation at the high temperature, and further resists the thermal shock. In addition, at least two silicon oxide layers are formed by performing multiple chemical vapor deposition processes, there is no need for extra replacement of raw materials on the midway, there is also no need for extra replacement of apparatuses, the raw material cost and the storage cost are decreased, no new material needs to be added to the bill of materials, and it is convenient to the flow manage and purchase. Meanwhile the chemical vapor deposition technology is mature, can well control the usage of the silicon oxide, and further decrease the production manufacturing cost, so that the display panel has a stronger product competitiveness. Of course, the second protection layer 15 may also be provided with two layers in the same method.

Figure 4:
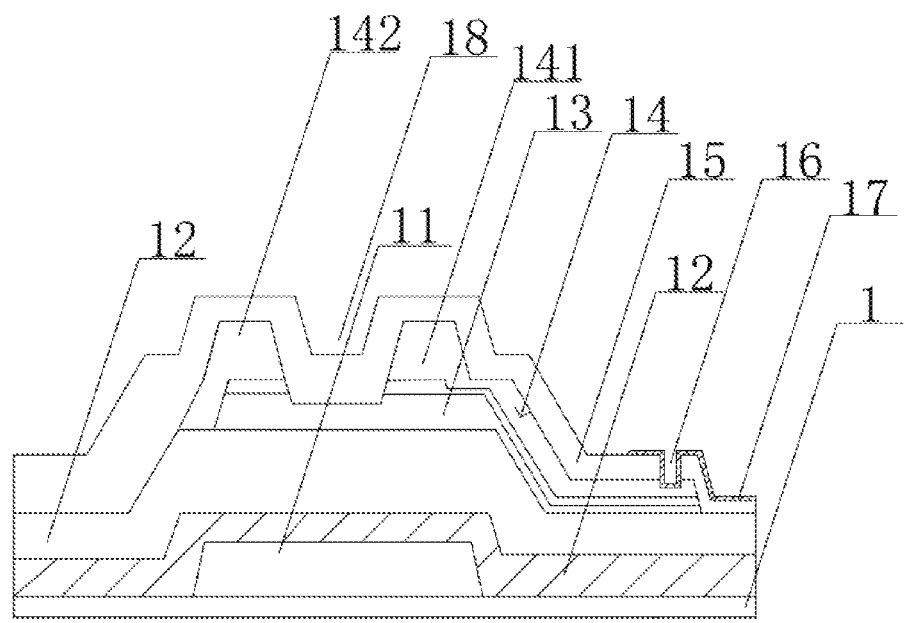
FIG. 4 is a schematic structure view showing a display panel according to an embodiment of this disclosure.

As shown in FIG. 4, as a still another embodiment of this disclosure, the protection layer includes the silicon nitride layer and the silicon oxide layer. Before the silicon oxide is deposited onto the metal layer using the chemical vapor deposition (CVD) technology, using the hydrogen ions to bombard the metal layer can effectively solve the problem of the surface oxidation of the metal layer, and using the redox reaction of the hydrogen ions to reduce the metal oxide to the metal can simultaneously effectively solve the problem of the too-short waiting time between the processes of the metal layer and the protection layer. The silicon oxide is deposited on the metal layer by the chemical vapor deposition technology, the waiting for the silicon oxide layer to cool and solidify into the first layer of the first protection layer 12 is conducted, and then the chemical vapor deposition technology deposits the silicon nitride on the silicon oxide layer to form the second layer of the first protection layer 12. Of course, the silicon nitride layer may also be firstly provided as the first layer of the first protection layer 12, and then the silicon oxide layer is covered on the silicon nitride layer to form the second layer of the first protection layer 12. The silicon nitride layer and the silicon oxide layer are stacked together, so that the protective layer can be better attached to the metal layer, can better cover the metal burrs on the metal layer and very effectively prevent the metal burrs from being exposed outside the protection layer, so that the protection layer can better protect the metal layer and can very effectively prevent the detergent from direct eroding the metal layer of the TFT substrate, so that the metal layer can be kept intact to thus prevent the breaking problem form occurring and further improve the durability of the display panel. Of course, the second protection layer 15 may also be provided with two layers using the same stacked silicon nitride layer and silicon oxide layer.

The second protection layer 15 is formed with a transparent electrode layer 17, the second protection layer 15 is provided with an opening 16, and the transparent electrode layer 17 is connected to the second metal layer 14 through the opening 16. By providing the opening 16 on the second protection layer 15, it is convenient for the transparent electrode layer 17 to be connected to the second metal layer 14, and it is ensured that the display panel has good display effect. Before the transparent electrode layer 17 is provided, using the hydrogen ions to bombard the second metal layer 14 at the opening 16 can effectively solve the problem of the surface oxidation of the second metal layer 14. Using the redox reaction of the hydrogen ions to reduce the metal oxide on the second metal layer 14 to the metal can simultaneously effectively solve the problem of the too-short waiting time between the process of the second metal layer 14 and the process of the transparent electrode layer 17. Then, the transparent electrode layer 17 is provided on the second metal layer 14 having been bombard, the transparent electrode layer 17 can effectively protect the second metal layer 14 at the opening 16 and further avoid the surface oxidation condition of the metal layer.

Figure 5:
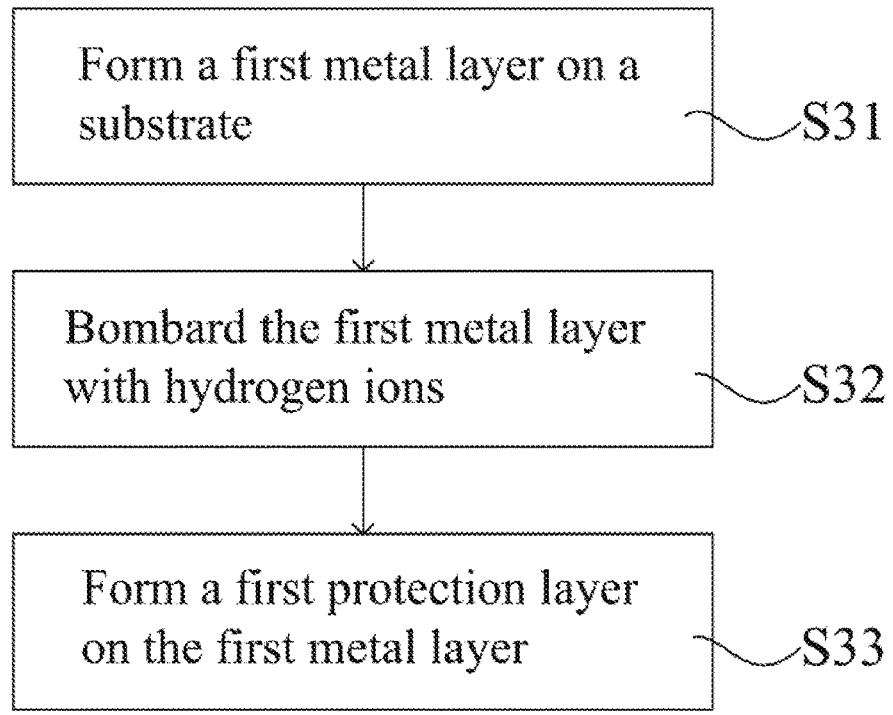
FIG. 5 is a flow chart showing a method of manufacturing an TFT substrate according to an embodiment of this disclosure.

As shown in FIG. 5, the method of forming the metal layer on the substrate 1 includes a step S31 of forming a first metal layer on the substrate.

The method of bombarding the metal layer with the hydrogen ions includes a step S32 of bombarding the first metal layer with hydrogen ions.

The method of disposing the protection layer on the metal layer includes a step S33 of forming a first protection layer on the first metal layer.

Before the first protection layer 12 is provided, using the hydrogen ions to bombard the first metal layer 11 can effectively solve the problem of the surface oxidation of the first metal layer 11. Using the reduction-oxidation (redox) reaction of the hydrogen ions to reduce the metal oxide to the metal can simultaneously effectively solve the problem of the too-short waiting time between the processes of the first metal layer 11 and the first protection layer 12. The first protection layer 12 is provided on the first metal layer 11 having been bombarded with the hydrogen ions, and the provision of the first protection layer 12 can effectively protect the first metal layer 11, and further avoid the surface oxidation condition of the first metal layer 11. In addition, the micro-structures on the lateral sides of the first metal layer 11 have the metal burr phenomenon, and the provision of the first protection layer 12 can better cover the metal burrs on the first metal layer 11 and very effectively prevent the metal burrs from being exposed outside the first protection layer 12. Meanwhile, the provision of the first protection layer 12 makes the region, having the problems caused by the process, be reworked and repaired without scrapping the TFT substrate of the thin film transistors, so that the further green environment protection is achieved.

Figure 6:
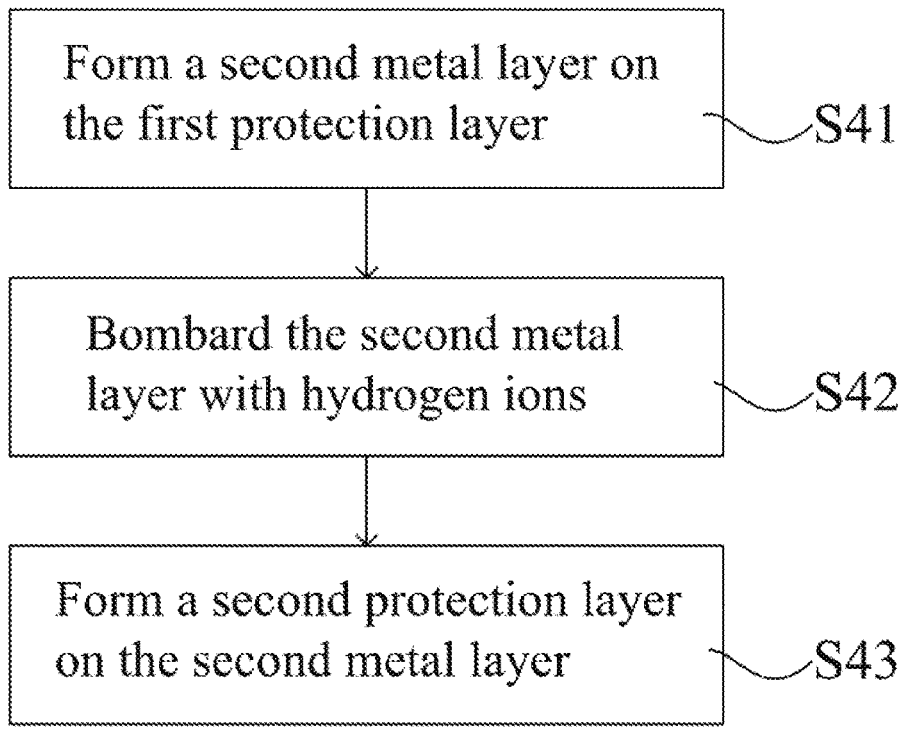
FIG. 6 is a flow chart showing a method of manufacturing an TFT substrate according to an embodiment of this disclosure.

As shown in FIG. 6, the method of forming the metal layer on the substrate 1 includes a step S41 of forming a second metal layer on the first protection layer.

The method of bombarding the metal layer with the hydrogen ions includes a step S42 of bombarding the second metal layer with hydrogen ions.

The method of disposing the protection layer on the metal layer includes a step S43 of forming a second protection layer on the second metal layer.

Before the second protection layer 15 is provided, using the hydrogen ions to bombard the second metal layer 14 can effectively solve the problem of the surface oxidation of the second metal layer 14. Using the redox reaction of the hydrogen ions to reduce the metal oxide to the metal can simultaneously effectively solve the problem of the too-short waiting time between the process of the second metal layer 14 and the process of the second protection layer 15. The second protection layer 15 is provided on the second metal layer 14 having been bombarded with the hydrogen ions, the provision of the second protection layer 15 can effectively protect the second metal layer 14, and further avoid the surface oxidation condition of the second metal layer. In addition, the micro-structures on the lateral sides of the second metal layer 14 have the metal burr phenomenon, and the provision of the second protection layer 15 can better cover the metal burrs on the second metal layer 14 and very effectively prevent the metal burrs from being exposed outside the second protection layer 15. Meanwhile, the provision of the second protection layer 15 makes the region, having the problems caused by the process, be reworked and repaired without scrapping the TFT substrate of the thin film transistors, so that the further green environment protection is achieved.

Figure 7:
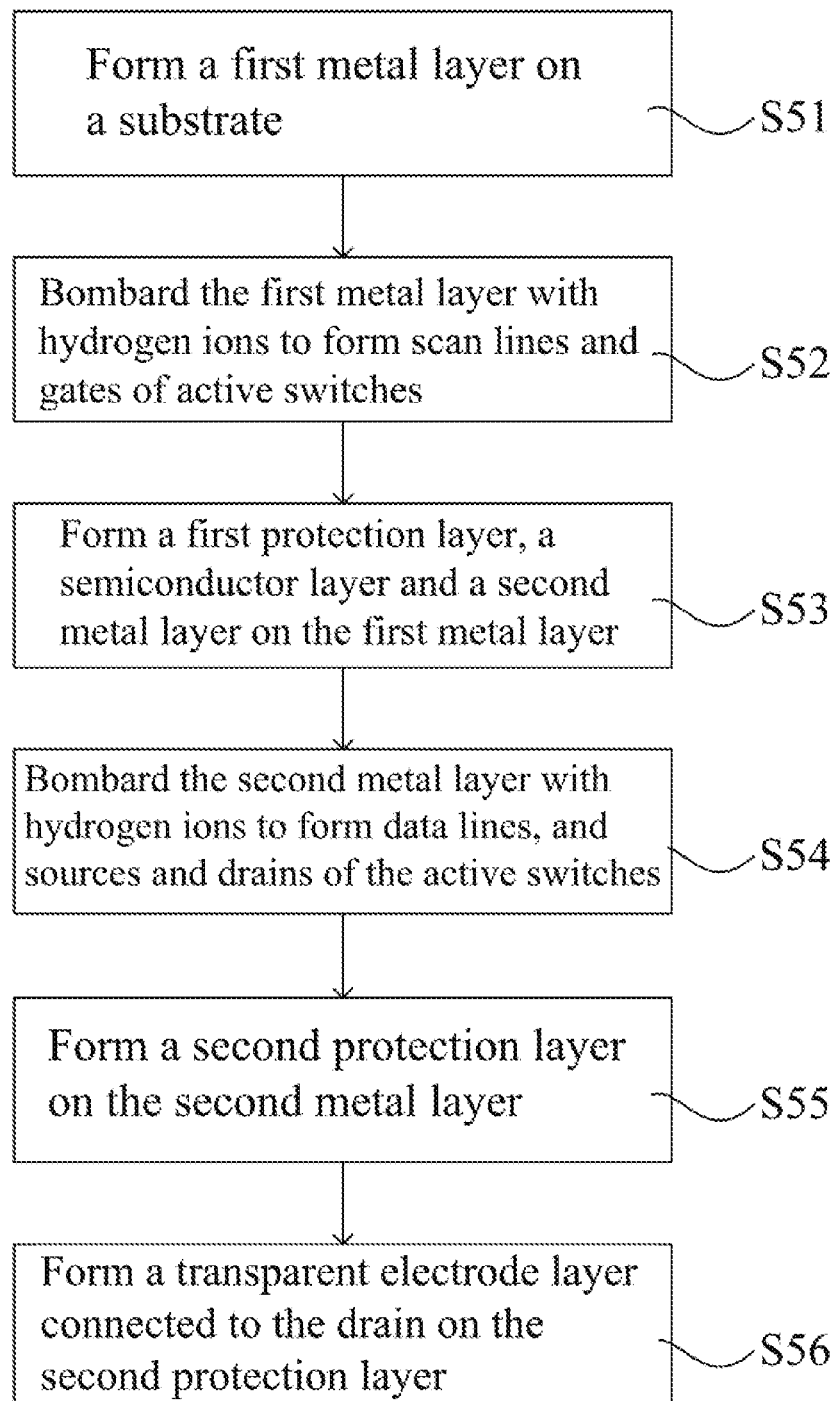
FIG. 7 is a flow chart showing a method of manufacturing an TFT substrate according to an embodiment of this disclosure.

As shown in FIG. 7, a method of manufacturing a TFT substrate includes the following steps.

In a step S51, a first metal layer is formed on the substrate.

In a step S52, the first metal layer is bombarded with the hydrogen ions to form scan lines and gates of active switches.

In a step S53, a first protection layer, a semiconductor layer and a second metal layer are formed on the first metal layer.

In a step S54, the second metal layer is bombarded with the hydrogen ions to form data lines, and sources and drains of the active switches.

In a step S55, a second protection layer is formed on the second metal layer.

In a step S56, a transparent electrode layer connected to the drain is formed on the second protection layer.

In a first mask process, the substrate 1 is firstly cleaned, the first metal material layer is sputtered onto the substrate 1 after cleaning, the cleaning before the formation of the film is performed after the sputtering of the first metal material layer is completed, the photoresist is then coated on the first metal material layer after cleaning, the photoresist is aligned and exposed using the first mask, the developer is used to develop the first metal material layer to obtain the pattern of the first metal layer 11, the etchant is then used to etch the first metal material layer to obtain the first metal layer 11, the residual photoresist is removed, and the checking of the first mask process is completed.

In a second mask process, the substrate 1, on which the first mask process is finished, is firstly cleaned, the first protection layer 12 is deposited on the first metal layer 11 using the chemical vapor deposition technology, the semiconductor material layer is formed on the first protection layer 12 after cleaning, the cleaning before the formation of the film is performed after the sputtering of the semiconductor material layer is completed, the second metal material layer is then formed on the semiconductor material layer after cleaning, the photoresist is then coated on the second metal material layer after cleaning, the photoresist is aligned and exposed using the second mask, the developer is used to develop the second metal material layer to obtain the pattern of the second metal layer 14, the etchant is then used to etch the semiconductor material layer to obtain the second metal layer 14, the photoresist is aligned and exposed using the second mask, the pattern of the semiconductor layer 13 is obtained by developing the semiconductor material layer, the semiconductor layer 13 is then obtained by dry etching the semiconductor material layer, the residual photoresist is removed, and the checking of the second mask process is completed.

Using the hydrogen ions to bombard the first metal layer 11 before the first protection layer 12 is provided in the second mask process can effectively solve the problem of the surface oxidation of first metal layer 11. Using the redox reaction of the hydrogen ions to reduce the metal oxide to the metal can simultaneously effectively solve the problem of the too-short waiting time between the first metal layer 11 and the first protection layer 12.

In a third mask process, the substrate 1, on which the second mask process is finished, is firstly cleaned, the second protection material layer is formed on the second metal layer 14 after cleaning, the photoresist is then coated on the second metal material layer, the photoresist is aligned and exposed using the third mask, the developer is used to develop the second protection material layer to obtain the pattern of the second protection layer 15, the etchant is then used to etch the second protection material layer to obtain the second protection layer 15, the residual photoresist is removed, and the checking of the third mask process is completed.

Using the hydrogen ions to bombard the second metal layer 14 before the second protection layer 15 is provided in the third mask process can effectively solve the problem of the surface oxidation of the second metal layer 14. Using the redox reaction of the hydrogen ions to reduce the metal oxide to the metal can simultaneously effectively solve the problem of the too-short waiting time between the second metal layer 14 and the second protection layer 15.

In a fourth mask process, the substrate 1, on which the third mask process is finished, is firstly cleaned, the transparent electrode material layer is formed on the second protection layer 15 after cleaning, the photoresist is then coated on the transparent electrode material layer, the photoresist is aligned and exposed using the fourth mask, the developer is used to develop the transparent electrode material layer to obtain the pattern of the transparent electrode layer 17, the etchant is then used to etch the transparent electrode material layer to obtain the transparent electrode layer 17, the residual photoresist is removed, and the checking of the fourth mask process is completed.

Figure 8:
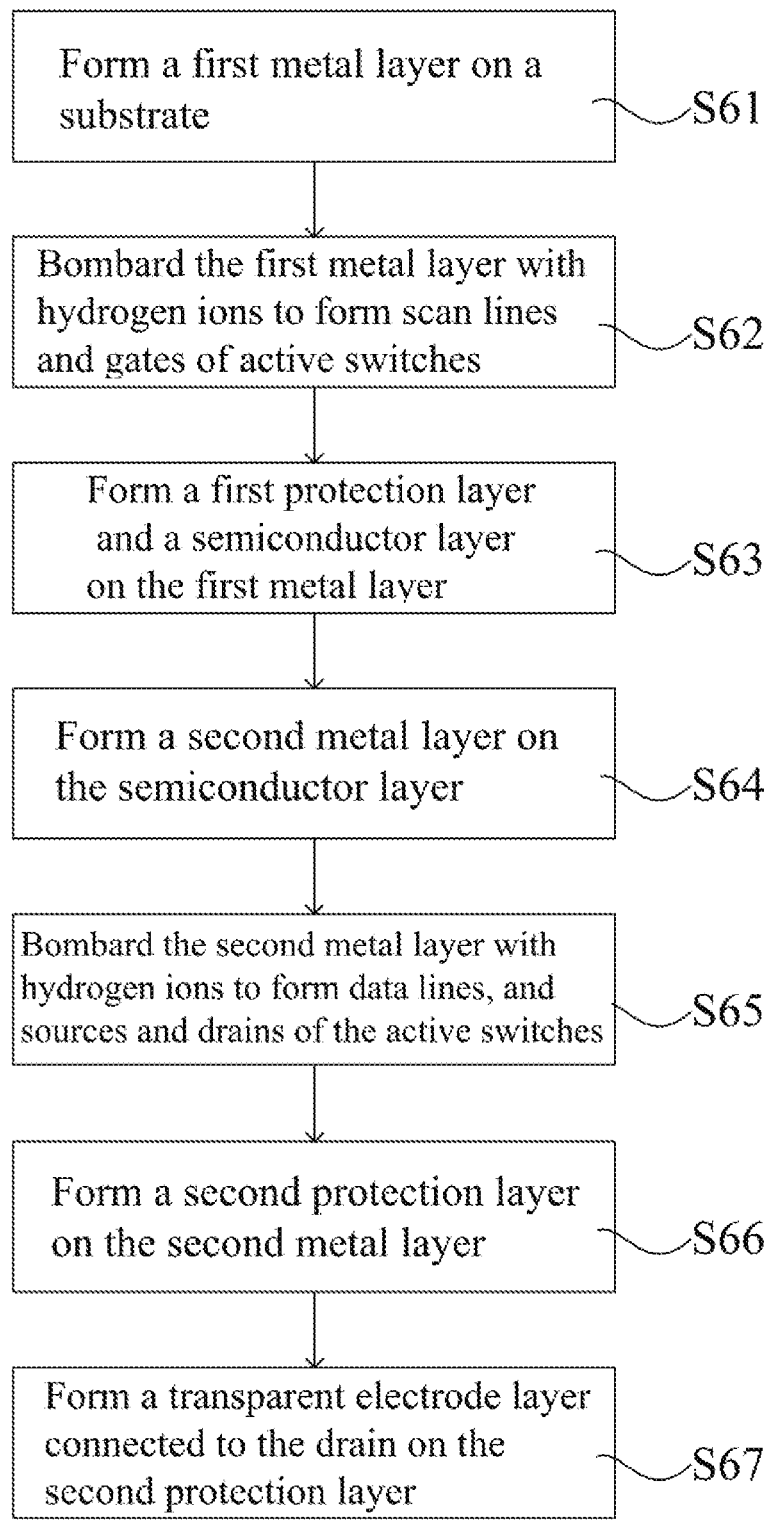
FIG. 8 is a flow chart showing a method of manufacturing an TFT substrate according to an embodiment of this disclosure.

As shown in FIG. 8, a method of manufacturing a TFT substrate includes the following steps.

In a step S61, a first metal layer is formed on the substrate.

In a step S62, the first metal layer is bombarded with the hydrogen ions to form scan lines and gates of active switches.

In a step S63, a first protection layer and a semiconductor layer are formed on the first metal layer.

In a step S64, a second metal layer is formed on the semiconductor layer.

In a step S65, the second metal layer is bombarded with the hydrogen ions to form data lines, and sources and drains of the active switches.

In a step S66, a second protection layer is formed on the second metal layer.

In a step S67, a transparent electrode layer connected to the drain is formed on the second protection layer.

In a first mask process, the substrate 1 is firstly cleaned, the first metal material layer is sputtered onto the substrate 1 after cleaning, the cleaning before the formation of the film is performed after the sputtering of the first metal material layer is completed, the photoresist is then coated on the first metal material layer after cleaning, the photoresist is aligned and exposed using the first mask, the developer is used to develop the first metal material layer to obtain the pattern of the first metal layer 11, the etchant is then used to etch the first metal material layer to obtain the first metal layer 11, the residual photoresist is removed, and the checking of the first mask process is completed.

In a second mask process, the substrate 1, on which the first mask process is finished, is firstly cleaned, the first protection layer 12 is deposited on the first metal layer 11 using the chemical vapor deposition technology, the semiconductor material layer is formed on the first protection layer 12 after cleaning, the cleaning before the formation of the film is performed after the sputtering of the semiconductor material layer is completed, the photoresist is then coated on the semiconductor material layer after cleaning, the photoresist is aligned and exposed using the second mask, the developer is used to develop the semiconductor material layer to obtain the pattern of the semiconductor layer 13, the residual photoresist is removed, and the checking of the second mask process is completed.

Using the hydrogen ions to bombard the first metal layer 11 before the first protection layer 12 is provided in the second mask process can effectively solve the problem of the surface oxidation of first metal layer 11. Using the redox reaction of the hydrogen ions to reduce the metal oxide to the metal can simultaneously effectively solve the problem of the too-short waiting time between the processes of the first metal layer 11 and the first protection layer 12.

In the third mask process, the substrate 1, on which the second mask process is finished, is firstly cleaned, a second metal material layer is formed on the semiconductor layer 13 after cleaning, the cleaning before the formation of the film is performed after the sputtering of the second metal material layer is completed, the photoresist is then coated on the second metal material layer after cleaning, the photoresist is aligned and exposed using the third mask, the developer is used to develop the second metal material layer to obtain the pattern of the second metal layer 14, the etchant is then used to etch the second metal material layer to obtain the second metal layer 14, the residual photoresist is removed, and the checking of the third mask process is completed.

In a fourth mask process, the substrate 1, on which the third mask process is finished, is firstly cleaned, the second protection material layer is formed on the second metal layer 14 after cleaning, the photoresist is then coated on the second metal material layer, the photoresist is aligned and exposed using the third mask, the developer is used to develop the second protection material layer to obtain the pattern of the second protection layer 15, the etchant is then used to etch the second protection material layer to obtain the second protection layer 15, the residual photoresist is removed, and the checking of the fourth mask process is completed.

Using the hydrogen ions to bombard the second metal layer 14 before the second protection layer 15 is provided in the fourth mask process can effectively solve the problem of the surface oxidation of the second metal layer 14. Using the redox reaction of the hydrogen ions to reduce the metal oxide to the metal can simultaneously effectively solve the problem of the too-short waiting time between the second metal layer 14 and the second protection layer 15.

In a fifth mask process, the substrate 1, on which the fourth mask process is finished, is firstly cleaned, the transparent electrode material layer is formed on the second protection layer 15 after cleaning, the photoresist is then coated on the transparent electrode material layer, the photoresist is aligned and exposed using the fifth mask, the developer is used to develop the transparent electrode material layer to obtain the pattern of the transparent electrode layer 17, the etchant is then used to etch the transparent electrode material layer to obtain the transparent electrode layer 17, the residual photoresist is removed, and the checking of the fifth mask process is completed.

Figure 9:
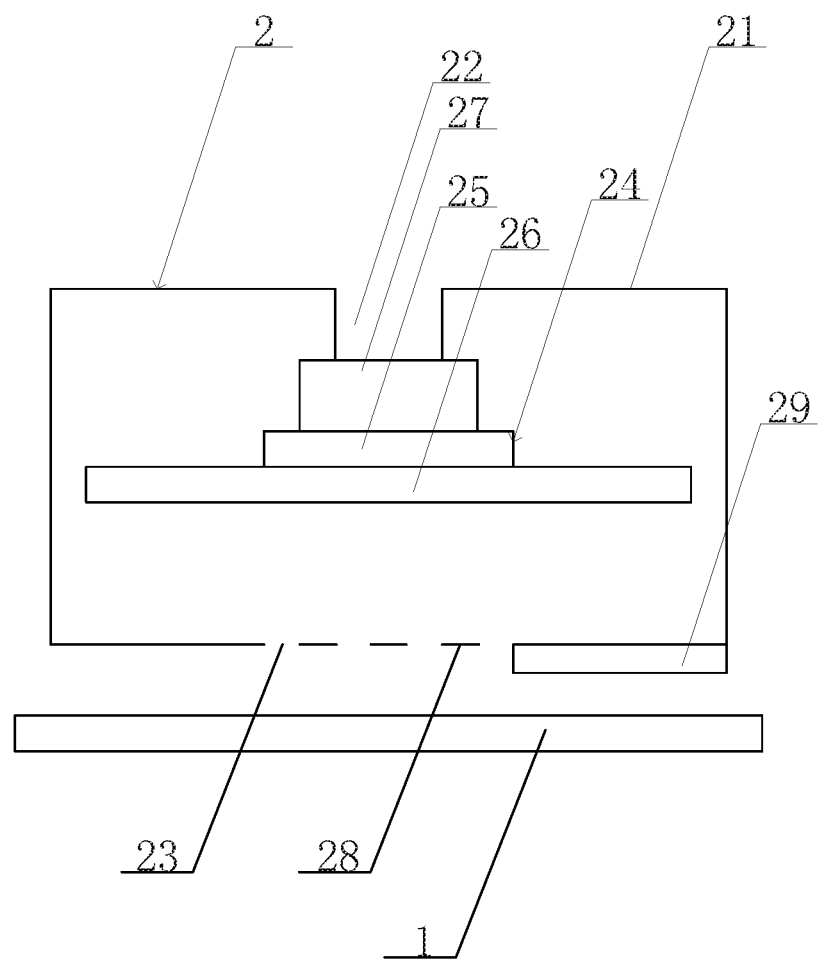
FIG. 9 is a schematic structure view showing a manufacturing apparatus according to an embodiment of this disclosure.

As shown in FIG. 9, according to another aspect of this disclosure, this disclosure further discloses a manufacturing apparatus 2 of the display panel, which includes: a gas inlet 22 for injecting hydrogen and air; a dissociating device 24 for dissociating the hydrogen into hydrogen ions; a gas outlet 23 for releasing the hydrogen ions to bombard the metal layer; and a coating device 29 for forming a protection layer on the metal layer.

The manufacturing apparatus 2 also includes a housing 21 and a coating device 29. The gas inlet 22 and the gas outlet 23 are disposed on the housing 21, and the dissociating device 24 is disposed inside the housing 21. The dissociating device 24 includes a high voltage electrode 25 and a ceramic electrode 26. The dissociating device 24 is connected to the gas inlet 22 through a cooling sleeve 27.

Injecting the mixed gas of the hydrogen and the air through the gas inlet 22 can effectively avoid the excessive hydrogen concentration, and thus further ensure the production security of the display panel. When the hydrogen passes through the dissociating device 24, the high voltage electrode 25 and the ceramic electrode 26 cooperate to make the hydrogen form the hydrogen ions. The hydrogen ions pass through the gas outlet 23, accelerate and fly to the surface of the metal layer to treat the metal layer on the display panel, and this can effectively solve the problem of the surface oxidation of the metal layer. Using the redox reaction of the hydrogen ions to reduce the metal oxide to the metal can simultaneously effectively solve the problem of the too-short waiting time between the processes of the metal layer and the protection layer.

The housing 21 includes an anti-electrostatic board 28, the gas outlet 23 is disposed on the anti-electrostatic board 28, and the gas outlet 23 produces an electric arc phenomenon. The anti-electrostatic board 28 can effectively isolate the electrostatic charges, and ensure that the manufacturing apparatus 2 is capable of making the hydrogen ions better act on the surface of the metal layer. The hydrogen ions pass through the gas outlet 23 accelerate and fly to the surface of the metal layer to treat the metal layer on the display panel, and this can effectively solve the problem of the surface oxidation of the metal layer. Using the redox reaction of the hydrogen ions to reduce the metal oxide to the metal can simultaneously effectively solve the problem of the too-short waiting time between the processes of the metal layer and the protection layer.

According to another aspect of this disclosure, the disclosure further discloses a display panel having a TFT substrate manufactured by the above-mentioned methods.

In some embodiments, the display panel is, for example, a liquid crystal display panel, an OLED display panel, a QLED display panel, a curved display panel, or any of other display panels.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A method of manufacturing a TFT substrate, comprising:
    providing a substrate;
    forming a first metal layer on the substrate;
    dissociating hydrogen into hydrogen atoms;
    ionizing the hydrogen atoms into hydrogen ions;
    bombarding the first metal layer with the hydrogen ions to form scan lines and gates of active switches;
    forming a first protection layer and a semiconductor layer on the first metal layer;
    forming a second metal layer on the semiconductor layer;
    bombarding the second metal layer with the hydrogen ions to form data lines, and sources and drains of the active switches;
    forming a second protection layer on the second metal layer; and
    forming a transparent electrode layer connected to the drain on the second protection layer.

2. The method according to claim 1, wherein the step of bombarding the second metal layer with the hydrogen ions comprises:
    dissociating the hydrogen into hydrogen atoms;
    ionizing the hydrogen atoms into hydrogen ions; and
    bombarding the metal layer with the hydrogen ions.

3. The method according to claim 1, wherein the second protection layer is provided with an opening, and the transparent electrode layer is connected to the second metal layer through the opening.

4. The method according to claim 1, wherein the first metal layer and the second metal layer are made of copper, aluminum, silver, gold or an alloy of the above-mentioned metals.

5. The method according to claim 1, wherein each of the first protection layer and the second protection layer is a silicon nitride layer and/or a silicon oxide layer.

6. The method according to claim 5, wherein the first protection layer and the second protection layer are stacked in two layers.

7. The method according to claim 5, wherein the first protection layer and the second protection layer are made of the same material.

8. The method according to claim 5, wherein the first protection layer and the second protection layer are made of different materials.

9. A manufacturing apparatus of a TFT substrate, comprising:
- a gas inlet configured to inject hydrogen and air;
- a dissociating device configured to dissociate the hydrogen into hydrogen ions;
- a gas outlet configured to release the hydrogen ions to bombard a metal layer; and
- a coating device configured to form a protection layer on the metal layer;
- wherein the manufacturing apparatus further comprises a housing, the gas inlet and the gas outlet are disposed on the housing, the dissociating device is disposed inside the housing, the dissociating device comprises a high voltage electrode and a ceramic electrode, the dissociating device is connected to the gas inlet through a cooling sleeve, the housing comprises an anti-electrostatic board, and the gas outlet is disposed on the anti-electrostatic board.

* * * * *